(12) United States Patent  
Xie

(10) Patent No.: US 10,600,816 B2  
(45) Date of Patent: Mar. 24, 2020

(54) ARRAY SUBSTRATE COMPRISING GRAPHENE CONDUCTIVE LAYER AND MANUFACTURING METHOD OF THE SAME

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Huafei Xie, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/002,220

(22) Filed: Jun. 7, 2018

(65) Prior Publication Data

US 2019/0157302 A1    May 23, 2019

Related U.S. Application Data

(63) Continuation of application No. PCT/CN2018/074011, filed on Jan. 24, 2018.

(30) Foreign Application Priority Data

Nov. 17, 2017   (CN) .......................... 2017 1 1143747

(51) Int. Cl.  
*H01L 27/12*    (2006.01)  
*G02F 1/1368*   (2006.01)  
(Continued)

(52) U.S. Cl.  
CPC .......... *H01L 27/124* (2013.01); *G02F 1/1368* (2013.01); *G02F 1/133514* (2013.01);  
(Continued)

(58) Field of Classification Search  
CPC ....................................................... H01L 29/45  
See application file for complete search history.

(56) References Cited

U.S. PATENT DOCUMENTS

2011/0168998 A1* 7/2011 Liang ................ H01L 29/42384  
257/57  
2013/0001573 A1* 1/2013 Lee .......................... H01L 29/45  
257/60

FOREIGN PATENT DOCUMENTS

CN          102331642 A       1/2012  
CN          102856364 A       1/2013  
(Continued)

*Primary Examiner* — Daniel Whalen  
(74) *Attorney, Agent, or Firm* — Hemisphere Law, PLLC; Zhigang Ma

(57) ABSTRACT

The present disclosure provides an array substrate including a substrate, an active layer disposed on the substrate, a conductive layer, a source and a drain. The conductive layer is disposed on two opposite sides of the active layer and is in contact with the active layer, the conductive layer forms a gap on the active layer to expose the partial surface of the active layer, the source and the drain are respectively disposed on the conductive layer on two opposite sides of the active layer. The material of the conductive layer is graphene. A conductive layer of graphene is added between the active layer, the source and the drain form a good conductive between the source and the drain to effectively reduce the contact resistance between the active layer and the source and the drain, thereby effectively improving the on-state current of the electronic device and the carrier mobility.

2 Claims, 2 Drawing Sheets

(51) Int. Cl.
*G02F 1/1335* (2006.01)
*H01L 29/778* (2006.01)
*H01L 29/786* (2006.01)
*H01L 51/10* (2006.01)
*H01L 29/45* (2006.01)
*H01L 29/66* (2006.01)
*H01L 29/16* (2006.01)
*H01L 51/05* (2006.01)
*H01L 51/00* (2006.01)

(52) U.S. Cl.
CPC ...... *H01L 27/1218* (2013.01); *H01L 27/1262* (2013.01); *H01L 27/1288* (2013.01); *H01L 27/1292* (2013.01); *H01L 29/1606* (2013.01); *H01L 29/45* (2013.01); *H01L 29/66045* (2013.01); *H01L 29/66742* (2013.01); *H01L 29/778* (2013.01); *H01L 29/78618* (2013.01); *H01L 29/78648* (2013.01); *H01L 29/78684* (2013.01); *H01L 51/105* (2013.01); *G02F 2001/13685* (2013.01); *H01L 51/0045* (2013.01); *H01L 51/0512* (2013.01); *H01L 51/0558* (2013.01)

(56) References Cited

FOREIGN PATENT DOCUMENTS

| CN | 102916050 A | 2/2013 |
| --- | --- | --- |
| CN | 104319285 A | 1/2015 |
| CN | 104377246 A | 2/2015 |
| CN | 104409515 A | 3/2015 |
| CN | 104505405 A | 4/2015 |
| CN | 105789442 A | 7/2016 |
| CN | 106876451 A | 6/2017 |
| CN | 107093607 A | 8/2017 |

* cited by examiner

ARRAY SUBSTRATE COMPRISING GRAPHENE CONDUCTIVE LAYER AND MANUFACTURING METHOD OF THE SAME

RELATED APPLICATIONS

This application is a continuation application of PCT Patent Application No. PCT/CN2018/074011, filed Jan. 24, 2018, which claims the priority benefit of Chinese Patent Application No. CN 201711143747.2, filed Nov. 17, 2017, which is herein incorporated by reference in its entirety.

FIELD OF THE DISCLOSURE

The present disclosure relates to a display technology field, and more particularly to an array substrate, a display panel and a manufacturing method of an array substrate.

BACKGROUND OF THE DISCLOSURE

Since the existing research on carbon-based thin film transistors of electronic devices has focused on how to improve the density, uniformity. There are few studies on the contact resistance of the active layer and the source/drain metal electrode in terms of how to control the polarity of carriers in the channel and how to improve the carrier mobility. The contact resistance on the regulation of electronic devices have a significant impact on the performance, such as the electronic device on-state current and carrier mobility.

SUMMARY OF THE DISCLOSURE

An object of the present disclosure is to provide an array substrate, a display panel and a manufacturing method of an array substrate for reducing the contact resistance between the active layer and the source/drain metal electrodes and improving the on-state current and the carrier mobility of the electronic device.

The present disclosure provides an array substrate including a substrate, an active layer disposed on the substrate, a conductive layer, a source and a drain, wherein the conductive layer is disposed on two opposite sides of the active layer and are in contact with the active layer, the conductive layer forms a gap on the active layer to expose the partial surface of the active layer, the source and the drain are respectively disposed on the conductive layer on two opposite sides of the active layer.

The material of the conductive layer is graphene.

The surface of the substrate is provided with a gate and a gate insulating layer covering the gate, and the active layer is disposed on the gate insulating layer.

The array substrate further includes an insulating protective layer, a gate provided on the insulating protective layer and a passivation protective layer covering the gate, the insulating protective layer covers the source, the drain and the gap formed on the active layer.

The array substrate further includes an insulating layer covering the source, the drain and the gap formed on the active layer.

The present disclosure further provides a display panel including the above array substrate, a color filter substrate, and a liquid crystal molecule layer sealed between the array substrate and the color filter substrate.

The present disclosure also provides a manufacturing method of an array substrate, including:
providing a substrate and disposing an active layer thereon;
forming a conductive layer in contact with the active layer on two opposite sides of the active layer, wherein the conductive layer forms a gap on the active layer to expose the partial surface of the active layer; and
forming a source and a drain respectively on the conductive layer on the two opposite sides of the active layer.

The step of forming a conductive layer in contact with the active layer on two opposite sides of the active layer includes depositing a bottom gate on the substrate, and depositing a gate insulating layer covering the bottom gate.

The step of forming a source and a drain respectively on the conductive layer on the two opposite sides of the active layer further includes depositing an insulating protective layer between the source, the drain and the gap on the active layer, depositing a top gate on the insulating protective layer and depositing a passivation protective layer covering the top gate on the top gate.

The photoresist is used to protect the gap on the active layer, the substrate is immersed into the conductive layer solution to deposit the conductive layer, after the deposition was completed, the substrate was baked at 150° C. for 30 minutes to remove excess conductive layer solution for drying the substrate.

In summary, a graphene conductive layer is added between the active layer in the present disclosure, the source and the drain form a good conductive between the source and the drain to effectively reduce the contact resistance between the active layer and the source and the drain, thereby effectively improving the on-state current of the electronic device and the carrier mobility.

BRIEF DESCRIPTION OF THE DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

DETAILED DESCRIPTION OF PREFERRED EMBODIMENTS

Figure 1:
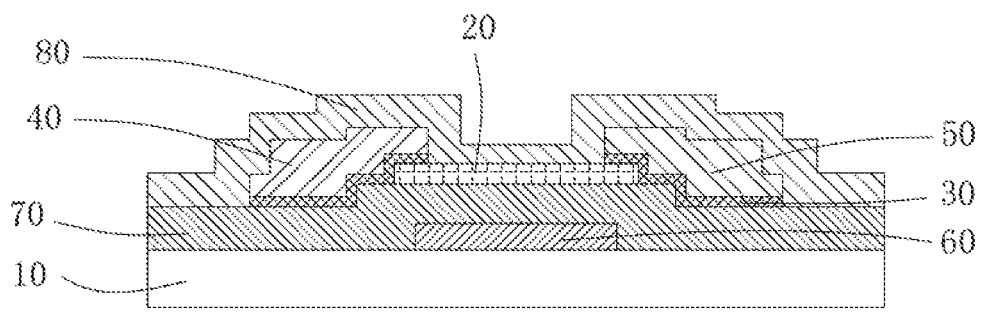
FIG. 1 is a schematic structural diagram of an array substrate according to Embodiment 1 of the present disclosure.

Please refer to FIG. 1, the present disclosure provides an array substrate including a substrate 10, an active layer 20 disposed on the substrate, a conductive layer 30, a source 40, a drain 50, the conductive layer 30 is disposed on opposite sides of the active layer 20 and are in contact with the active layer 20. the conductive layer 30 forms a gap on the active layer 20 exposing a partial surface of the active layer 20. The source 40 and the drain 50 are respectively disposed on the conductive layer 30 on two opposite sides of the active layer 20. The material of the conductive layer 30 is graphene. The beneficial effect is that a graphene conductive layer 30 is added between the active layer 20, the source 40 and the drain 50 form a good conductive between the source 40 and the drain 50 to effectively reduce the contact resistance between the active layer 20 and the source 40 and the drain 50, thereby effectively improving the on-state current of the electronic device and the carrier mobility.

In Embodiment 1 of the present disclosure, the bottom surface of the substrate 10 is provided with a bottom gate 60 and a gate insulating layer 70 covering the bottom gate 60. The gate insulating layer 70 is used to insulate the gate 60 from the active layer 20. The active layer 20 is disposed on the gate insulating layer 70.

The array substrate further includes an insulating layer 80 covering the gaps between the source 40, the drain 50 and the active layer.

In the present embodiment, the substrate 10 includes, but is not limited to, a silicon wafer, quartz, glass, and flexible plastic. The bottom gate 60 includes, but is not limited to, copper, molybdenum, aluminum and indium tin oxide.

The gate insulating layer 70 and the insulating layer 80 include, but are not limited to, silicon dioxide, graphene oxide, and organic insulating material. The active layer 20 includes, but is not limited to, a semiconducting carbon nanotube nanocarbon-based material and a doped graphene nanocarbon-based material.

Figure 2:
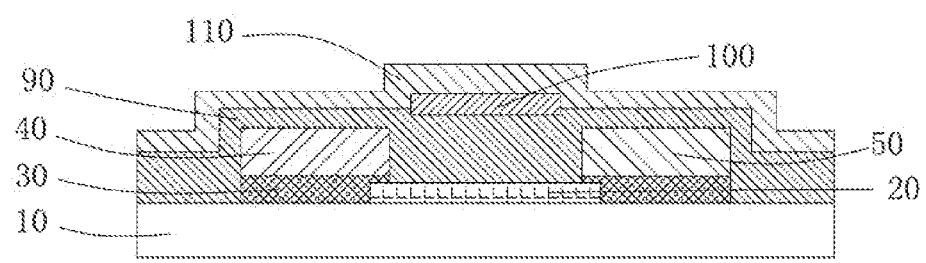
FIG. 2 is a schematic structural diagram of an array substrate according to Embodiment 2 of the present disclosure.

Please refer to FIG. 2, in the second embodiment of the present disclosure, the array substrate further includes an insulating protective layer 90, a top gate 100 disposed on the insulating protective layer 90, and a passivation protective layer 110 covering the top gate 100. The insulating protective layer 90 covers the source 40, the drain 50 and the gap on the active layer 20.

In the present embodiment, the substrate 10 includes, but is not limited to, a silicon wafer, quartz, glass, and a flexible plastic. The top gate 100 includes, but is not limited to, copper, molybdenum, aluminum and indium tin oxide.

The insulating protective layer 90 and the passivation protective layer 110 include, but are not limited to, silicon oxide, graphene oxide, and an organic insulating material. The active layer 20 includes, but is not limited to, a semiconducting carbon nanotube nanocarbon-based material and a doped graphene nanocarbon-based material.

Figure 3:
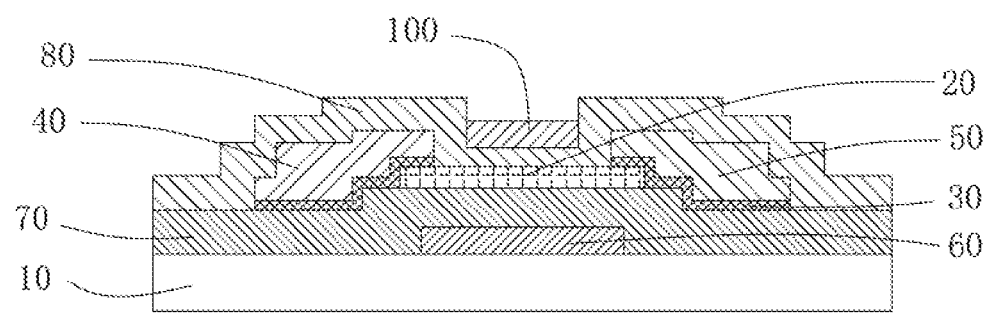
FIG. 3 is a schematic structural diagram of an array substrate according to Embodiment 3 of the present disclosure.

Please refer to FIG. 3, in Embodiment 3 of the present disclosure, the bottom surface of the substrate 10 is provided with a bottom gate 60 and a gate insulating layer 70 covering the bottom gate 60. The gate insulating layer 70 is used to insulate the bottom gate 60 from the active layer 20. The active layer 20 is disposed on the gate insulating layer 70.

The array substrate further includes an insulating layer 80 and a top gate 100 disposed on the insulating layer 80. The insulating layer 80 covers the source 40, the drain 50 and the gap on the active layer.

In this embodiment, the substrate 10 includes, but is not limited to, a silicon wafer, quartz, glass, and flexible plastic. The bottom gate 60 and the top gate 100 include but are not limited to copper, molybdenum, aluminum and indium tin oxide.

The gate insulating layer 70 and the insulating layer 80 include, but are not limited to, silicon dioxide, graphene oxide, and organic insulating material. The active layer 20 includes, but is not limited to, a semiconducting carbon nanotube nanocarbon-based material and a doped graphene nanocarbon-based material.

Figure 4:
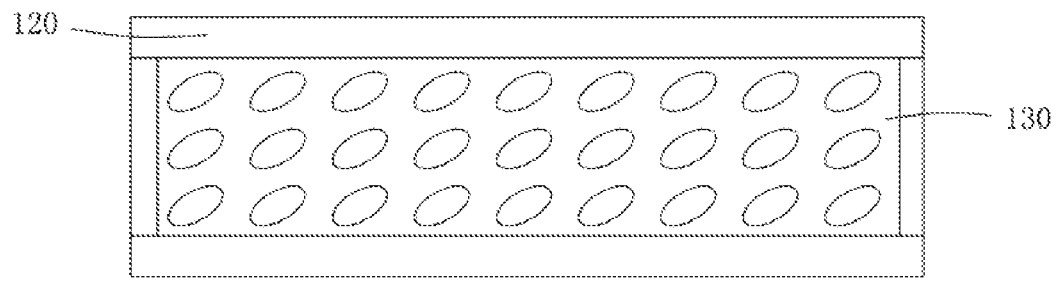
FIG. 4 is a schematic structural diagram of a display panel according to the embodiment of the present disclosure.

Referring to FIG. 4, the present disclosure further provides a display panel, which includes the array substrate, the color filter substrate 120, and the liquid crystal molecule layer 130 sealed between the array substrate and the color filter substrate 120.

The liquid crystal molecule layer 130 can control the brightness of light emitted from the display screen by twisting. The color filter substrate 120 combined with the liquid crystal molecule layer 40 can adjust the brightness of the three primary colors to obtain a desired color display.

Figure 5:
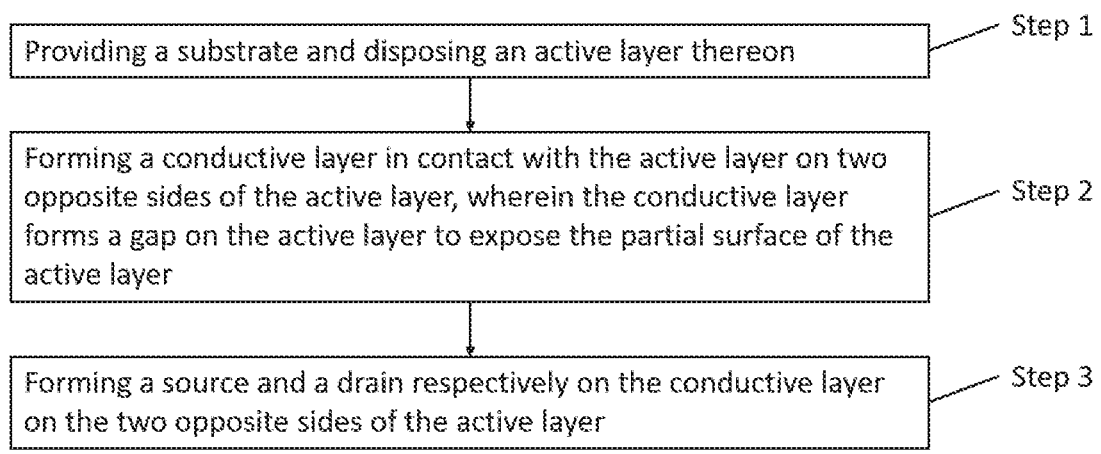
FIG. 5 is a schematic flow chart of a manufacturing method of an array substrate according to the embodiment of the present disclosure.

Referring to FIG. 5, the present disclosure further provides a manufacturing method of an array substrate, including the following steps.

Step 1. Providing a substrate 10 and disposing an active layer 20 thereon. The material of the active layer 20 is carbon nanotube nanocarbon-based material.

Step 2. Forming a conductive layer 30 in contact with the active layer 20 on two opposite sides of the active layer 20, wherein the conductive layer 30 forms a gap on the active layer 20 to expose a partial surface of the active layer 20. The material of the conductive layer 30 is graphene.

Step 3. Forming a source 40 and a drain 50 respectively on the conductive layer 30 on the two opposite sides of the active layer 20.

The step of forming the conductive layer 30 in contact with the active layer 20 on opposite sides of the active layer 20 includes depositing a bottom gate 60 on the substrate 10, depositing a gate insulating layer 70 covering the bottom gate 60.

Further, the step of forming the source 40 and the drain 50 respectively on the conductive layer 30 on the two opposite sides of the active layer 20 further includes depositing an insulating layer 80 on the source 40, the drain 50, and the gap on the active layer, and depositing a top gate 100 on the insulating layer 80.

The step of forming the source 40 and the drain 50 respectively on the conductive layer 30 on the two opposite sides of the active layer 20 includes depositing an insulating protective layer 90 on the source 40, the drain 50 and the gap on the active layer 20, depositing a top gate 100 on the insulating protective layer 90 and depositing a passivation protective layer 110 covering the top gate 100. The passivation protective layer 110 is made of silicon dioxide.

Further, the bottom gate 60 and the top gate 100 are prepared by depositing a metal film on the substrate 10 by magnetron sputtering or electron beam evaporation technology. The bottom gate 60 and the top gate 100 are patterned by photoresist and chemical exposure. The gate insulating layer 70 is prepared by depositing a gate insulating layer 70 on the bottom gate 60 by a chemical vapor deposition method.

Further, the carbon nanotube active layer 20 is prepared by soaking and rinsing the substrate 10 covered with the gate insulating layer 70 with acetone, methanol and isopropanol, and then blowing with nitrogen, the substrate 10 covered with the gate insulating layer 70 is immersed in a carbon nanotube solution to deposit a carbon nanotube film. After the deposition, the substrate 10 is taken out and baked at 150° C. for 30 min to obtain a carbon nanotube network-like thin film, and the excess carbon nanotubes are removed by oxygen plasma.

Further, the graphene conductive layer 30 is prepared by using a photoresist to protect the gap on the active layer 20, immersing the substrate 10 in the graphene solution to deposit the graphene film. After the deposition, the substrate 10 is baked at 150° C. for 30 minutes to remove excess graphene solution, and the substrate 10 is dried.

Further, the source 40 and the drain 50 are prepared by depositing a metal conductive film on the substrate 10 on which the graphene conductive layer 30 is deposited by magnetron sputtering or electron beam evaporation. Removing the graphene and the metal film on the photoresist and the photoresist by a lift-off technique to obtain a complete gap of the carbon nanotube active layer, the graphene conductive layer 30, the source 40 and the drain 50.

Further, the silicon dioxide passivation protective layer 110 is prepared by covering the gap between the source electrode 40, the drain electrode 50 and the active layer with a chemical vapor deposition method as a passivation protective 110 layer.

The above disclosure is only the preferred embodiments of the present disclosure, and certainly can not be used to limit the scope of the present disclosure. People of ordinary skill in the art may understand that all or part of the procedures for implementing the foregoing embodiments and equivalent changes made according to the claims of the present disclosure still fall within the scope of the present disclosure.

What is claimed is:

1. A manufacturing method of an array substrate, comprising:
   providing a substrate;
   depositing a bottom gate on the substrate, and depositing a gate insulating layer covering the bottom gate;
   disposing a carbon nanotube active layer on the gate insulating layer;
   forming a graphene conductive layer in contact with the active layer on two opposite sides of the carbon nanotube active layer, wherein the graphene conductive layer forms a gap on the carbon nanotube active layer to expose a partial surface of the carbon nanotube active layer; and
   forming a source and a drain respectively on the conductive layer on the two opposite sides of the carbon nanotube active layer;
   wherein the carbon nanotube active layer is prepared by soaking and rinsing the substrate covered with the gate insulating layer with acetone, methanol and isopropanol, and then blowing with nitrogen, the substrate covered with the gate insulating layer is immersed in a carbon nanotube solution to deposit a carbon nanotube film, after the deposition is complete, the substrate is taken out and baked at 150° C. for 30 min to obtain a carbon nanotube network-like thin film, and the excess carbon nanotubes are removed by oxygen plasma; and
   wherein a photoresist is used to protect the gap on the carbon nanotube active layer, the substrate is immersed into the graphene conductive layer solution to deposit the graphene conductive layer, after the deposition was completed, the substrate was baked at 150° C. for 30 minutes to remove excess graphene conductive layer solution for drying the substrate.

2. The manufacturing method of the array substrate according to claim 1, wherein the step of forming the source and the drain respectively on the conductive layer on the two opposite sides of the nanotube active layer further comprises depositing an insulating protective layer between the source, the drain and the gap on the active layer, depositing a top gate on the insulating protective layer and depositing a passivation protective layer covering the top gate on the top gate.

* * * * *